United States Patent [19]

Hirano

[11] Patent Number: 4,559,484
[45] Date of Patent: Dec. 17, 1985

[54] STOP-POSITION CONTROLLING DEVICE FOR ELECTRIC WINDSHIELD WIPER

[75] Inventor: Koki Hirano, Yokohama, Japan

[73] Assignee: Jidosha Denki Kogyo Kabushiki Kaisha, Kanagawa, Japan

[21] Appl. No.: 652,037

[22] Filed: Sep. 19, 1984

[30] Foreign Application Priority Data

Sep. 22, 1983 [JP] Japan .................... 58-175664
Sep. 22, 1983 [JP] Japan .................... 58-175665

[51] Int. Cl.$^4$ .............................................. B60S 1/08
[52] U.S. Cl. .................................... 318/443; 318/282;
318/286; 318/DIG. 2; 15/250.17
[58] Field of Search ............... 318/443, 444, DIG. 2,
318/282, 286, 467; 15/250 C, 250.16, 250.17;
307/10 R

[56] References Cited

U.S. PATENT DOCUMENTS 2,765,064 10/1956 Dyer ........................... 15/250.17 X
3,525,114 8/1970 Smith ............................ 15/250.16
3,694,723 9/1972 Schneider et al. ................. 318/443
4,350,938 9/1982 Ecole ...................... 318/DIG. 2 X

FOREIGN PATENT DOCUMENTS

3022442 12/1981 Fed. Rep. of Germany ...... 318/443
2052099 1/1981 United Kingdom ............... 318/443

Primary Examiner—B. Dobeck
Assistant Examiner—Bentsu Ro
Attorney, Agent, or Firm—Sughrue, Mion, Zinn, Macpeak & Seas

[57] ABSTRACT

A stop-position controlling device for an electric windshield wiper is disclosed, which comprises an oscillation means for a wiper blade and a switch mechanism provide with armature shortcircuiting contacts for forcedly stopping the wiper blade at a predetermined position under a turn-off state of a wiper switch. In this device, the armature shortcircuiting contacts are shifted at plural positions for forcedly stopping the wiper motor at different positions and a turnover means is further arranged therefor, or a contact moving means is disposed for displacing the armature shortcircuiting contacts to plural positions.

7 Claims, 20 Drawing Figures

STOP-POSITION CONTROLLING DEVICE FOR ELECTRIC WINDSHIELD WIPER

BACKGROUND OF THE INVENTION

1. Field of the Invention

This invention relates to a device for controlling a stop-position of an electric windshield wiper, which is used for wiping a window glass of an automobile or the like, to stop the wiper at a predetermined position (or a so-called auto park device).

2. Description of the Prior Art

Figure 1:
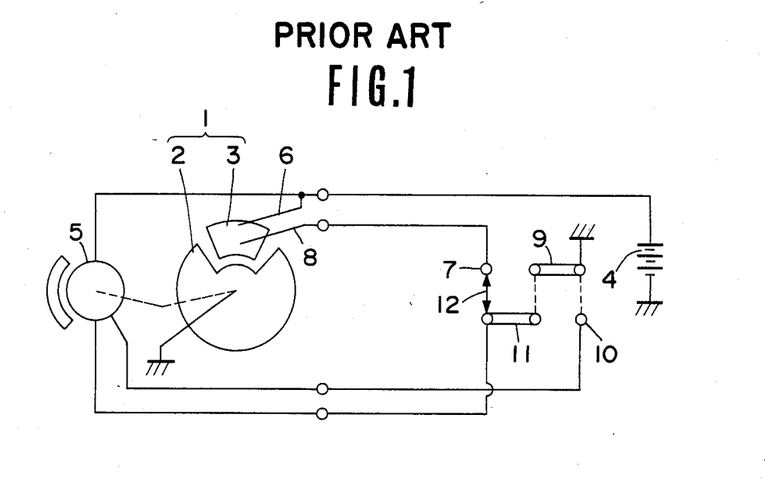
FIG. 1 is a circuit diagram illustrating the structure of the conventional stop-position controlling device for the electric windshield wiper as mentioned above.

Heretofore, there has been used a stop-position controlling device for an electric windshield wiper as shown in FIG. 1.

In FIG. 1, numeral 1 is a contact base rotating together with a worm wheel constituting a reduction mechanism of a wiper motor, which is composed of a first contact plate 2 of a disc form having a fan-shaped notch portion, and a second contact plate 3 disposed at a position corresponding to the notch portion apart from the first contact plate 2 and protruded from the first contact plate 2 toward the outside thereof.

To the contact base 1 are arranged a first contactor 6 communicating a power source 4 with an armature 5 and being capable of contacting with only the second contact plate 3, and a second contactor 8 connected to an off-terminal 7 and being capable of contacting with the first and second contact plate 2 and 3 at a side of a motor casing (not shown) in such a manner that the first and second contactors 6 and 8 are connected to each other through the second contact plate 3 every one rotation of the contact base 1. Further, since a wiper blade (not shown) reciprocates every one rotation of the worm wheel provided with the contact base 1, it takes a wipe-finishing position when the contactors 6 and 8 become at the connected state through the second contact plate 3.

Moreover, numeral 9 is an earth terminal of a control switch, numeral 10 a high-speed operating terminal, numeral 11 a low-speed operating terminal, and numeral 12 a movable contact connected to a wiper switch.

In the stop-position controlling device of the above mentioned structure, when the wiper switch is randomly turned off during the operation of the wiper, the movable contact 12 renders the off-terminal 7 and the low-speed operating terminal 11 into the contact state. In this case, electric current still flows through the contacting of the second contactor 8 with the first rotating contact plate 2 to continue the operation of the wiper. Then, when the second contactor 8 is separated from the first contact plate 2, the electric current is shut off from the power source 4. Thereafter, the first contactor 6 and the second contactor 8 are rendered into the contact state through the second contact plate 3, whereby the short-circuit of the armature 5 is formed to brake the operation of the wiper. Thus, the wiper can be always stopped at a wipe-finishing position.

Figure 2:
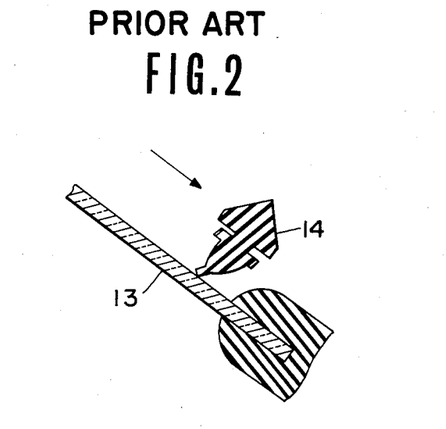
FIG. 2 is a sectional view showing the sectional shape of the wiper blade at the stopped state of the wiper as mentioned above.

In the conventional stop-position controlling device, however, a wiper blade 14 contacting with a surface of a window glass 13 at a given pushing force always stops at the wipe-finishing position under deformed state in one direction. As a result, the wiper blade 14 is subjected to permanent deformation under an influence of heat generated from sunlight, ultraviolet ray or the like in no use of the wiper and consequently there are caused troubles such as poor wiping, occurrence of vibration sound in the wiping and the like.

Therefore, it has been attempted to separate the wiper blade from the surface of the window glass in no use to thereby prevent the permanent deformation of the wiper blade or to arrange a wiper receiving means beneath the window so as not to come the wiper into vieww in no use. However, when the wiper blade is separated from the surface of the window glass in the wiper assembly having no wiper receiving means, the wiper blade is lifted outward every one reciprocating operation of the wiper, so that the wiping at the wipe-beginning and-finishing positions is not performed sufficiently. Further, there are some drawbacks that the structure becomes complicated, and the working sound in the lifting of the wiper is apt to be generated and the like.

SUMMARY OF THE INVENTION

It is, therefore, an object of the invention to solve the aforementioned drawbacks of the prior art and to provide a device for controlling a stop-position of an electric windshield wiper which can prevent permanent deformation of a wiper blade without separating the wiper blade from window glass surface and maintain a good wiping performance over a long period.

According to a first aspect of the invention, there is the provision of a device for controlling a stop-position of an electric windshield wiper, which comprises a means for converting rotary motion of a wiper motor into reciprocative motion of a wiper to oscillate a wiper blade on a surface to be wiped and a switch mechanism provided with armature shortcircuiting contacts for turning off the wiper motor from a power source and shortcircuiting the armature of the wiper motor to forcedly stop the wiper blade when the wiper blade reaches to a predetermined position under a turn-off state of a wiper switch, characterized in that said armature shortcircuiting contacts of the switch mechanism are shiftedly arranged at plural positions for forcedly stopping the wiper motor at different positions, and further a turnover means is arranged for the plural armature shortcircuiting contacts.

A second aspect of the invention is characterized by arranging a contact moving means for displacing said armature shortcircuiting contacts of the switch mechanism to plural positions for forcedly stopping the wiper motor at different positions.

DESCRIPTION OF THE PREFERRED EMBODIMENTS

In FIGS. 3 to 7 is shown a first embodiment of the stop-position controlling device for the electric windshield wiper according to the invention.

Figure 3:
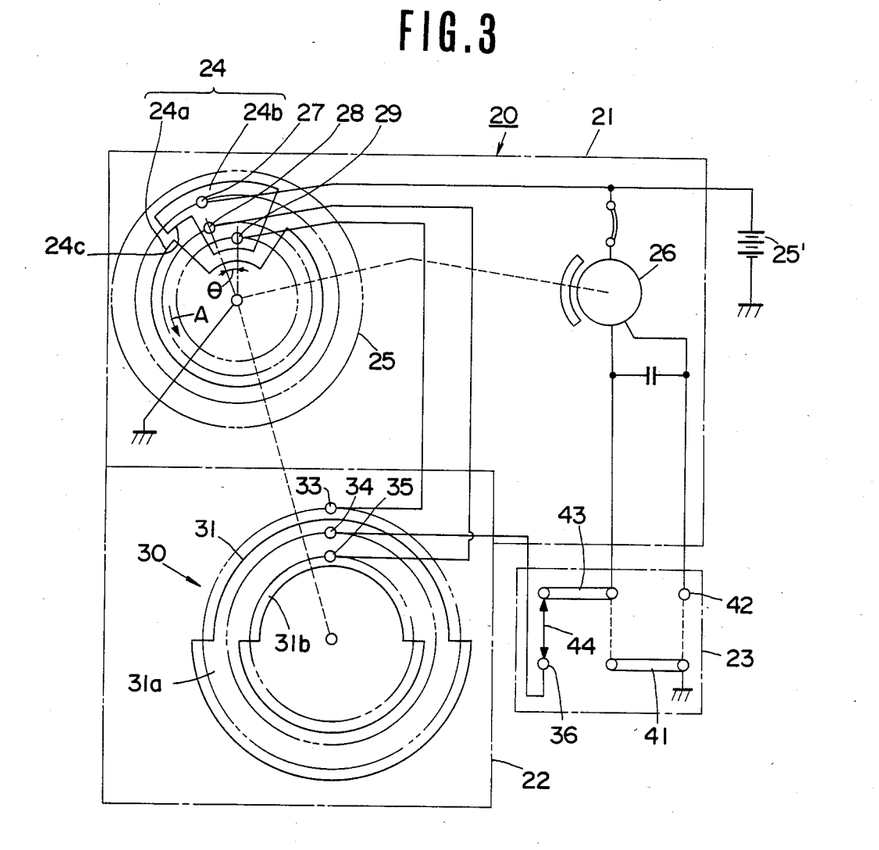
FIG. 3 is a circuit diagram of a first embodiment of the stop-position controlling device for the electric windshield wiper according to the invention.

That is, the stop-position controlling device 20 comprises a contact base circuit 21, a cam switch circuit 22 and a control switch circuit 23.

Figure 4:
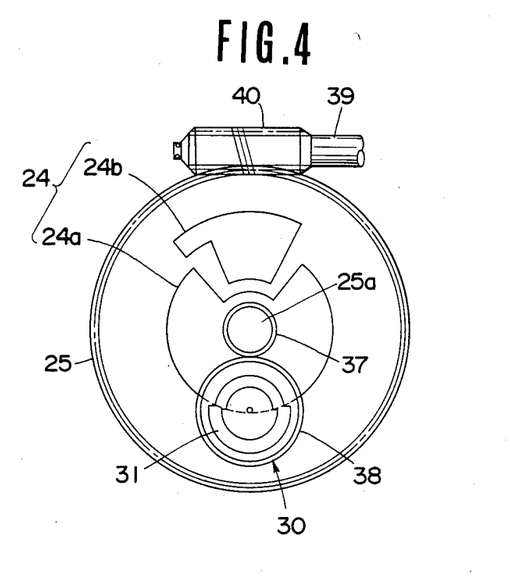
FIG. 4 is a schematic view of the reduction mechanism part for the wiper motor illustrating the arrangement of contact base and cam switch.

In the contact base circuit 21, a contact base 24 rotates together with a worm wheel 25 constituting a reduction mechanism of a wiper motor (not shown) as shown in FIG. 4, and comprises a first contact plate 24a having such a shape that a part of the disc is cut away into a fan-shaped notch, and a second contact plate 24b disposed at a position of the notch portion apart from the first contact plate 24a and protruded from the first contact plate 24a toward the outside thereof.

To the contact base 24 at a side of a motor casing (not shown) are arranged a first contactor 27 connected between a power source 25' and an armature 26 and being capable of contacting with only the second contact plate 24b, and second and third contactors 28,29 being capable of contacting with the first and second contact plates 24a, 24b. These three contactors 27, 28, 29 act as a switch mechanism for shortcircuiting the armature of the wiper motor to forcedly stop the operation thereof together with the contact base 24, in which the contacts of these contactors are disposed from the outer peripheral side of the contact base 24 toward the center thereof in order. Moreover, in order to differ the contacting time of the second contactor 28 from that of the third contactor 29 with respect to the contact base 24, the third contactor 29 is disposed at a position shifted from the first and second contactors 27, 28 by a central angle θ. And also, in order to simultaneously contact the first and third contactors 27, 29 with the second contact plate 24b when the contact base 24 is rotated in a direction of early contacting the third contactor 29 than the second contactor 28 with the second contact plate 24b (i.e. direction of arrow A in FIG. 3), an extension part 24c is formed on the second contact plate 24b alone an orbit of the first contactor 27 by a distance corresponding to the central angle θ.

The cam switch circuit 22 is a turnover means for armature shortcircuiting contact alternately switching the continuity to the second contactor 28 and the third contactor 29. For this purpose, a cam switch 30 comprises a large-diameter portion 31a corresponding to a remaining portion formed by cutting out about a half of an outer periphery of a third contact plate 31, and a small-diameter portion 31b corresponding to a remaining portion formed by cutting out almost an inner peripheral part of the large-diameter portion 31a. That is, the large-diameter portion 31a and the small-diameter portion 31b are arranged so as to shift the phase of both the portions by 180°.

To the cam switch 30 at the side of the motor casing (not shown) are arranged a fourth contactor 33 capable of contacting with only the large-diameter portion 31a of the third contact plate 31, a fifth contactor 34 always contacting with the third contact plate 31, and a sixth contactor 35 capable of contacting with only the small-diameter portion 31b of the third contact plate 31 in a direction from the outer periphery of the cam switch 30 toward the center thereof, wherein the fourth contactor 33 is connected to the third contactor 29 and the fifth contactor 34 is connected to an off-terminal 36 of the control switch circuit 23. As shown in FIG. 4, the cam switch 30 is rotated together with a toothed wheel 38 engaging with a small toothed wheel 37 coaxially fitted to a shaft 25a of the worm wheel 25 in such a manner that the cam switch 30 rotates by a half to one rotation of the worm wheel 25 engaged with a worm 40 formed on an end portion of a motor shaft 39.

Figure 5:
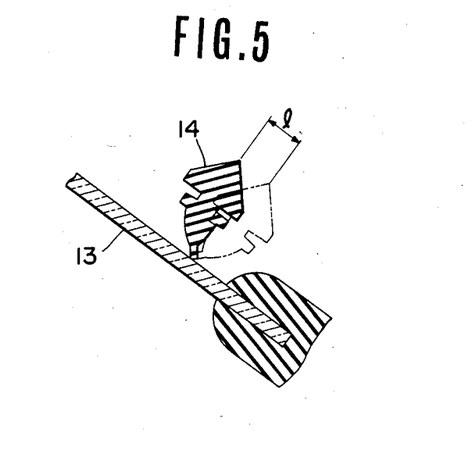
FIG. 5 is a sectional view showing the sectional shape of wiper blade at such a state that the wiper is stopped by the stop-position controlling device according to the invention.

On the other hand, a wiper blade is subjected to one reciprocal movement every one rotation of the worm wheel 25. In this case, a rotary moving amount from the third contactor 29 to the second contactor 28 shifted at a displacement of the central angle θ in the contact base circuit 21 corresponds to a length l between a wipe-finishing position of a wiper blade 14 (shown by a phantom line) and a position just after the wipe-beginning thereof (shown by a solid line) on a surface of a window glass 13 as shown in FIG. 5.

In the control switch circuit 23 of FIG. 3, numeral 41 is an earth terminal, numeral 42 a high-speed operating terminal connected to the armature 26, numeral 43 a low-speed operating terminal connected to the armature 26, and numeral 44 a movable contact moving and connecting to each terminal by the operation of a wiper switch.

The operation of the stop-position controlling device for the wiper having the above construction will be explained in detail below.

When the wiper switch is turned off at random, during the operation of the wiper, if the large-diameter portion 31a of the third contact plate 31 in the cam switch 30 locates at a side opposite to the fourth to sixth contactors 33–35 (i.e. at a state of FIG. 3), the sixth contact 35 comes into contact with the small-diameter portion 31b of the third contact plate 31, so that the fifth contactor 34, the third contact plate 31, the sixth contactor 35 and the second contactor 28 are communicated with each other by the low-speed operating terminal 43 and the off-terminal 36 connected to each other through the movable contact 44. Therefore, the operation of the wiper is continued during the contacting of the second contactor 28 with the rotating first contact plate 24a.

Figure 6A:
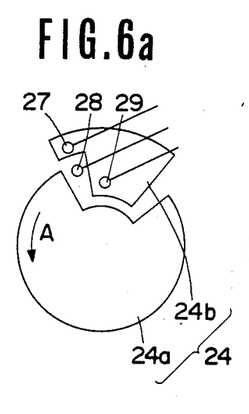
FIGS. 6a to 6c are schematic views successively illustrating states of cutting off a power through first and second contactors and breaking and stoppping a wiper through short circuit.
Figures 6B, 6C:
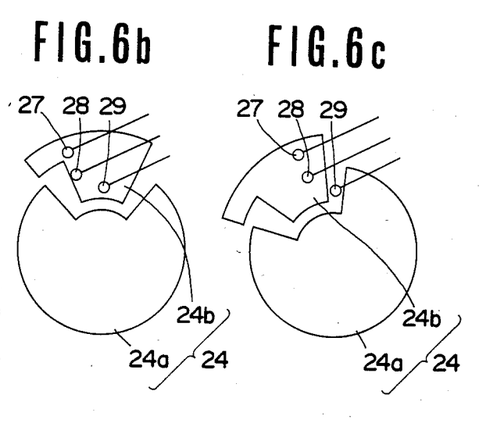

As shown in FIG. 6a, the rotation of the contact base 24 is further continued in the direction of arrow A together with the rotation of the worm wheel 25 to come off the second contactor 28 from the first contact plate 24a and at this time the power source is shut off. Then, as shown in FIG. 6b, when both the first and second contactors 27, 28 come into contact with the second contact plate 24b, the braking is started by the shortcircuiting of the armature 26. As shown in FIG. 6c, the movement of the wiper is stopped while the first and second contactors 27, 28 locate in the region of the second contact plate 24b.

In this way, the wiper is stopped at a position just after the change from the wipe-finishing to the wipe-beginning (position of the wiper blade 14 shown by the solid line in FIG. 5).

On the contrary, when the wiper switch is turned off at random during the operation of the wiper, if the large-diameter portion 31a of the third contact plate 31 in the cam switch 30 locates in a side of the fourth to sixth contactors 33-35 (at such a state that the cam switch 30 in FIG. 3 is rotated by 180°), the fourth contactor 33 comes into contact with the large-diameter portion 31a of the third contact plate 31, while the sixth contactor 35 is shut off from the small-diameter portion 31b of the third contact plate 31, so that the fifth contactor 34, the third contact plate 31, the fourth contactor 33 and the third contactor 29 are communicated with each other by the low-speed operating terminal 43 and the off-terminal 36 connected to each other through the movable contact 44. Therefore, the operation of the wiper is continued during the contacting of the third contactor 29 with the rotating first contact plate 24a.

Figure 7A:
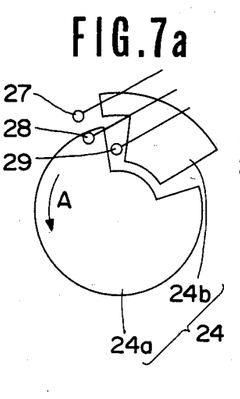
FIGS. 7a to 7c are schematic views successively illustrating states of cutting off a power through first and third contactors and breaking and stopping a wiper through short circuit.
Figures 7B, 7C:
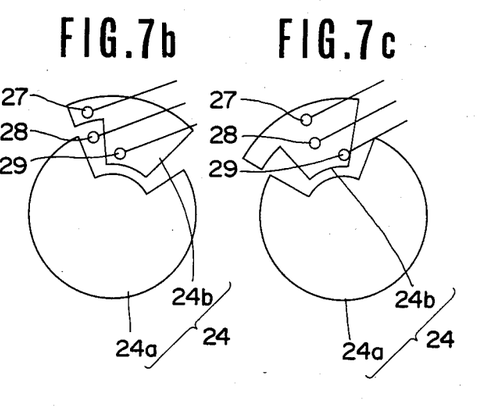

As shown in FIG. 7a, the rotation of the contact base 24 in further continued in the direction of arrow A together with the rotation of the worm wheel 25 to come off the third contactor 29 from the first contact plate 24 and at this time the power source is shut off. Then, as shown in FIG. 7b, when both the first and third contactors 27, 29 come into contact with the second contact plate 24b, the braking is started by the shortcircuiting of the armature. As shown in FIG. 7c, the movement of the wiper is stopped while the first and third contactors 27, 29 locate in the region of the second contact plate 24b.

Since the contacting time of the third contactor 29 to the second contact plate 24b is faster than that of the second contactor 28 by the rotational moving amount based on the central angle $\theta$ (see FIG. 3), which corresponds to the length l between the wipe-finishing position and the wipe-beginning position of the wiper, the beginning time of the braking becomes faster than the aforementioned stopping time by the first and second contactors 27, 28, so that the wiper is stopped at the stop-finishing position (i.e. a position of the wiper blade 14 shown by the phantom line in FIG. 5).

As mentioned above, the deformation direction of the wiper blade 14 is opposite at the wipe-finishing position and at the wipe-beginning position. That is, the stop-position of the wiper is determined by alternately turning over the continuity to the second and third contactors 28, 29 with the cam switch 30 every one rotation of the worm wheel 25 (one reciprocation of the wiper), so that the probability on the determination of these stop-positions is ½ when the wiper switch is turned off at random.

Therefore, the deformation of the wiper blade in one direction can be prevented in no use of the wiper.

Figure 8:
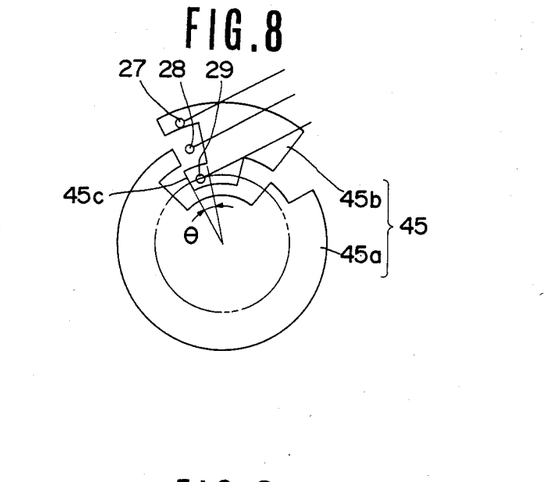
FIG. 8 is a schematic view illustrating another arrangement of contact base and contactors according to the invention.

In FIG. 8 is shown a second embodiment of the stop-position controlling device according to the invention.

In the aforementioned first embodiment, the third contactor 29 is shifted by the central angle $\theta$ to the first and second contactors 27, 28, whereby the contacting time to the second contact plate 24b is made different. On the contrary, in this second emodiment, the first, second and third contactors 27, 28 and 29 are radially arranged as a row in a direction from the center of a contact base 45 toward the outer periphery thereof, while one end side of a second contact plate 45b is cut out along an orbit of the third contactor 29 (shown by a phantom line) and the other end side thereof is provided with an extension part 45c corresponding to the cut out part, whereby the contacting time between the second contactor 28 and the third contactor 29 is made different. The length of the extension part 45c is equal to the rotary moving amount of the orbit depicted by the third contactor 29 on the basis of the central angle $\theta$ as described in the first embodiment.

Even when using the contact base 45 of the above construction, the stop-position of the wiper through the first and second contactors 27, 28 can be made different from the stop-position through the first and third contactors 27, 29 likewise the first embodiment, whereby the permanent deformation of the wiper blade 14 can be prevented.

Figure 9:
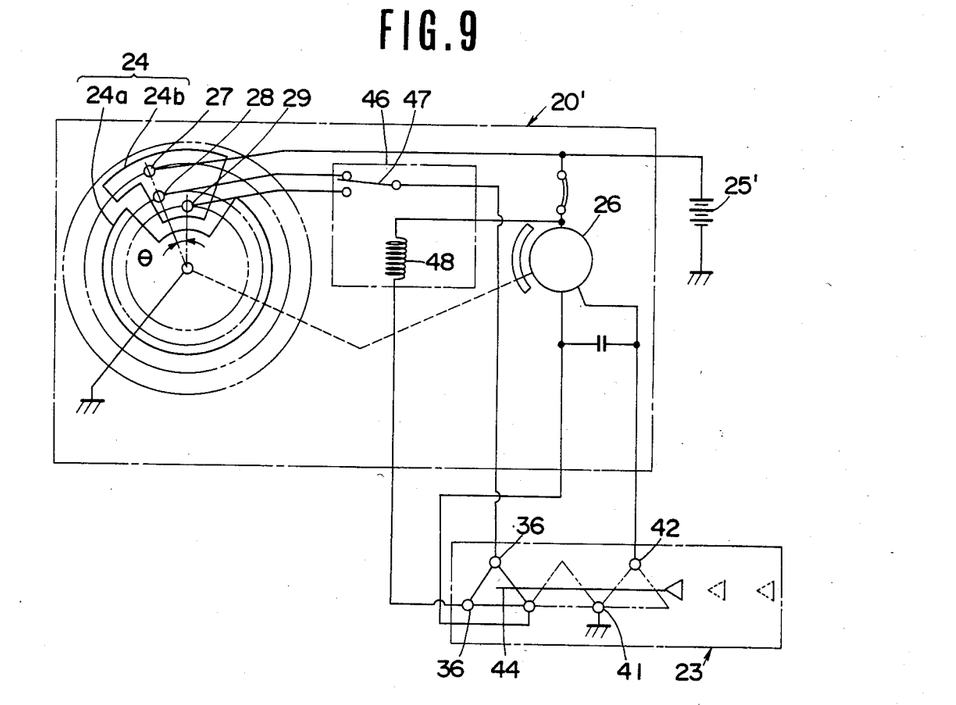
FIG. 9 is a circuit diagram of a second embodiment of the stop-position controlling device for the electric windshield wiper according to the invention.

In FIG. 9 is shown a third embodiment of the stop-position controlling device according to the invention.

As the turnover means for alternately turning over the continuity to the second contactor 28 and the third contactor 29, a self-holding type relay 46 is used in a stop-position controlling device 20' of this embodiment instead of the cam switch 30 used in the aforementioned embodiments.

This relay 46 comprises a movable contactor 47 for turning over the second contactor 28 and the third contactor 29. A fixed contact of the movable contactor 47 is connected to the off-terminal 36 of the control switch circuit 23 and further a relay coil 48 is connected between the power source 25' and the armature 26 on one hand and to the off-terminal 36 on the other hand. When the movable contact 44 of the control switch circuit 23 locates in an off-state (the state shown by a solid line in FIG. 9), the relay 46 acts to perform the turning over of the movable contactor 47 every the continuity of the relay coil 48.

In the embodiment of FIG. 9, the different contacting time between the second contactor 28 and the third contactor 29 is achieved by shifting the position of the third contactor 29 to the first and second contactors 27, 28 by the central angle $\theta$ likewise the first embodiment.

When using the self-holding type relay 46 as the turnover means as shown in the third embodiment, the stop-position of the wiper can surely and alternately be turned over every the turn-off of the wiper switch (see FIG. 5), whereby the prevention on the permanent deformation of the wiper blade can further be improved.

In FIGS. 10 to 15 is shown a fourth embodiment of the stop-position controlling device according to the invention.

Figure 10:
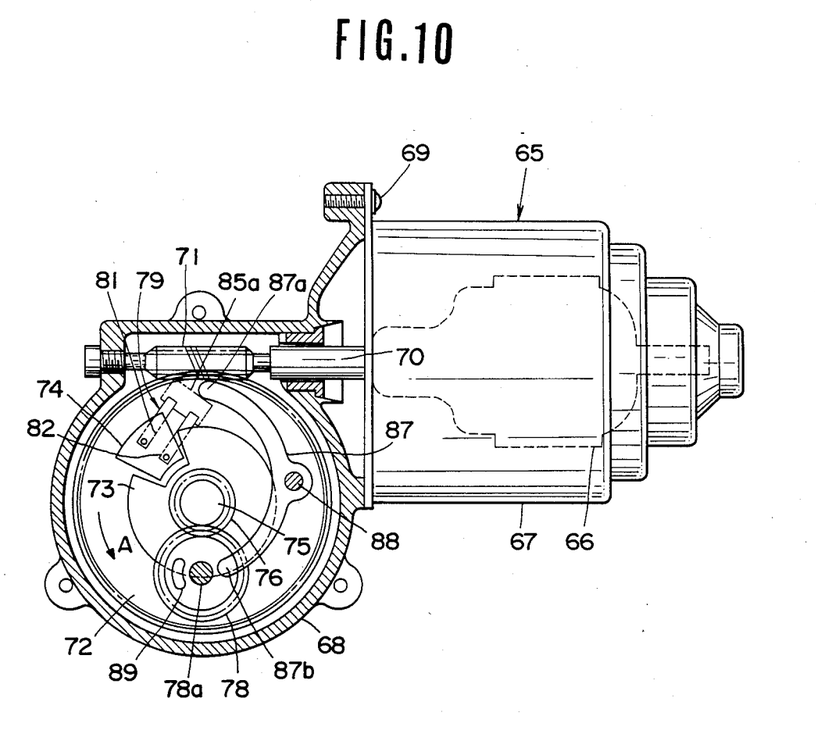
FIG. 10 is a partial sectional view of the wiper motor provides with a third embodiment of the stop-position controlling device for the electric windshield wiper according to the invention.

As shown in FIG. 10, a wiper motor 65 comprises a motor yoke 67 housing an armature 66 and a gear housing 68 connected to the yoke through screws 69. In the gear housing 68 is arranged a reduction mechanism comprising a worm 71 formed on a rotary shaft 70 of the armature 66 and a worm wheel 72 pivotably supported in the gear housing 68 and engaging with the worm 71.

Figure 11:
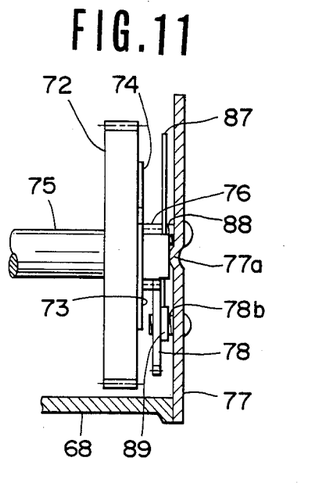
FIG. 11 is a sectional view of the side portion of the gear housing.
Figure 12:
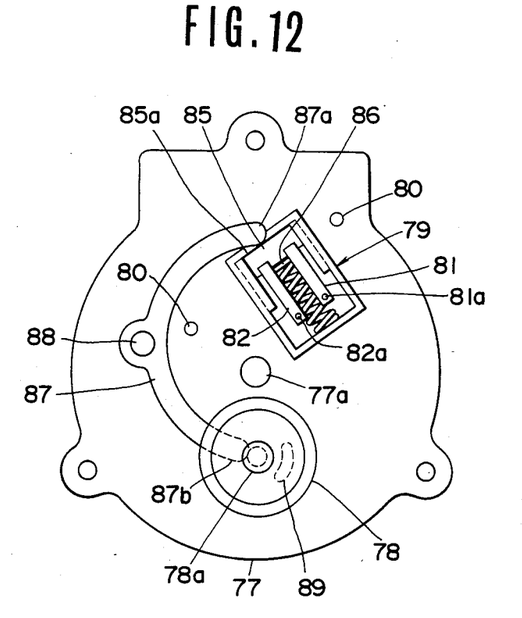
FIG. 12 is a front view illustrating the rear side of the cover.

In a side surface of the worm wheel 72 are arranged a first contact plate 73 of a disc shape having a fan-shaped notch portion at its outer periphery and a second contact plate 74 disposed at a position of the notch portion apart from the first contact plate 73 as one body, while a small toothed wheel 76 is coaxially fitted to a shaft 75 of the worm wheel 72. As shown in FIGS. 11 and 12, a toothed wheel 78 engaging with the small toothed wheel 76 is rotatably attached to a cover 77 of the gear housing 68 through a pin 78a.

The cover 77 is provided at its central portion with an embossed convex 77a receiving the shaft 75 of the worm wheel 72, while a contactor assembly 79 against the first and second contact plates 73, 74 is fixed to the cover 77 through plural rivets 80.

Figure 13:
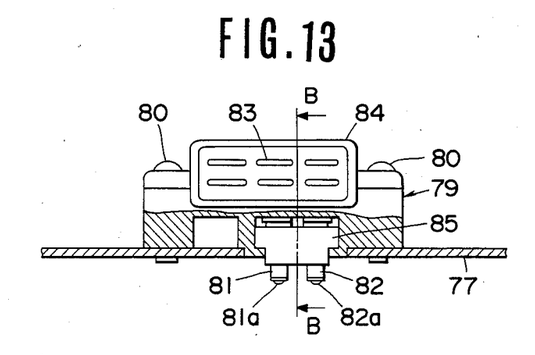
FIG. 13 is a partially broken schematic view of the contactor assembly.
Figure 14:
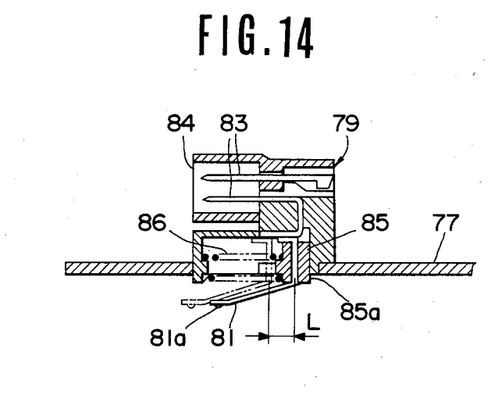
FIG. 14 is a sectional view taken along a line B—B of FIG. 13.

As shown in FIGS. 13 and 14, the contactor assembly 79 comprises a first contactor 81 located at a rear side of the cover 77 (or a lower side in FIGS. 13 and 14) near the outer periphery of the worm wheel 72 and capable of contacting with only the second contact plate 74, and a second contactor 82 located toward the center of the worm wheel 72 from the first contactor 81 and capable of contacting with both the first and second contact plates 73,74. Further, the contactor assembly 79 comprises a connector 84 having a plurality of terminals 83 at a front side of the cover 77 (or an upper side in FIGS. 13 and 14).

The first and second contactors 81, 82 are retained by a retaining member 85 slidably incorporated into the contactor assembly 79. Further, these contactors 81, 82 are provided at one end side with contacts 81a and 82a contacting with the contact plates 73 and 74, respectively, and the other end sides thereof passing through the retaining member 85 are always contacted with the terminals 83. On the other hand, the retaining member 85 is at such a state that the two contactors 81 and 82 are energized in one parallel moving direction (right-hand direction in FIG. 14) by means of a spring 86 inserted in the contactor assembly 79. Moreover, the first contactor 81 is connected between a power source and the armature 66 through the respective terminal 83, while the second contactor 82 is connected to an off-terminal through the respective terminal 83 likewise the case of the circuit shown in FIG. 1.

At the rear side of the cover 77 is pivotably fitted an arm 87 of a semi-circular curved shape as a contact moving means about a pin 88 located in the central portion of the arm 87. The one end ortion 87a of the arm 87 is contacted with an end surface 85a of the retaining member 85 at a side opposite to the side of the spring 86, and the other end portion 87b thereof is projected along the side surface of the toothed wheel 77.

On the side surface of the toothed wheel 78 is formed a protrusion 89 engaging with the other end portion 87b of the arm 87 in the rotation and pushing the arm 87 in the engagement. The toothed wheel 78 rotates by a half every one rotation of the worm wheel 72 or the small toothed wheel 76. That is, the protrusion 89 provided on the toothed wheel 78 rotating together with the rotation of the worm wheel 72, and the arm 87 form a cam mechanism pushing the retaining member 85.

Moreover, a wiper is connected to the worm wheel 72 through a link mechanism (not shown) and subjected to one reciprocating movement by one rotation of the worm wheel 72.

With respect to a length L of the retaining member 85 moved by the pivoting movement of the arm 87 (see FIG. 14), as shown in FIG. 5, the rotary moving amount of the worm wheel 72 is previously set at a valve corresponding to the length l between the wipe-finishing position (position shown by the phantom line in FIG. 5) and the position just after the wipe-beginning (position shown by the solid line in FIG. 5).

The operation of the stop-position controlling device for the wiper having the above construction will be explained in detail below.

When the wiper switch is turned off at random during the operation of the wiper, if the protrusion 89 of the toothed wheel 78 is not engaged with the other end portion 87b of the arm 87, the continuity to the armature 66 is performed to operate the wiper while the first contact plate 73 of the worm wheel 72 rotating in a given direction (shown by an arrow A in FIG. 10) is contacting with the second contactor 82.

When the second contactor 82 is separated from the first contact plate 73, the power source is shut off. Then, when both the first and second contactors 81, 82 come into contact with the second contact plate 74, the armature 66 forms a short circuit to brake the movement of the wiper.

Thereupon, the wiper reaches near the wipe-finishing position, and the oscillation speed of the wiper is reduced by the braking based on the shortcircuiting, so that the wiper completely stops at the wipe-finishing position as shown by the phantom line in FIG. 5.

Figure 15:
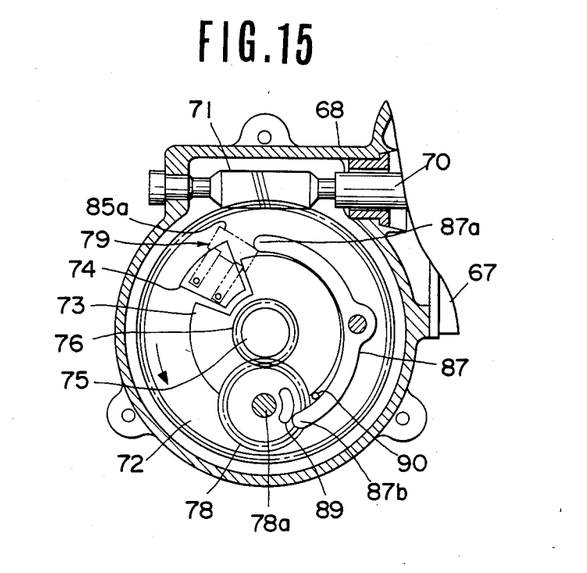
FIG. 15 is a partial sectional view of the wiper motor illustrating the engaged state of the projection with the end of the arm.

On the other hand, when the wiper switch is turned off at random, if the protrusion 89 of the toothed wheel 78 is engaged with the other end portion 87b of the arm 87 as shown in FIG. 15, the arm 87 is rotated around the pin 88 with the protrusion 89 and consequently the one end portion 87a of the arm 87 pushes the end surface 85a of the retaining member 85. Thereby, the pushed retaining member 85 compresses the spring 86 in the contactor assembly 79, whereby the first and second contactors 81 and 82 are moved by the length L in the rotation direction of the worm wheel 72 (see FIG. 14).

The continuity and shortcircuiting of the armature 66 are performed through the first and second contactors 81, 82 and the first and second contact plates 73, 74 in the same manner as described above. In this case, the contacting time between the first contactor 81 and the second contactor 82 is shifted by the amount moved in the rotation direction, so that the worm wheel 72 is further rotated by the length L as compared with the case of not shifting the contactors 81 and 82. As a result, the wiper completely stops at the position just after the wipe-beginning moved from the wipe-finishing position as shown by the solid line in FIG. 5.

Moreover, when the wiper is actuated again, the other end portion 87b of the arm 87 comes off from the protrusion 89, and hence the contactors 81 and 82 are returned back to the original position together with the retaining member 85 by the reaction force of the compressed spring 86. During the operation of the wiper, the reciprocate oscillation of the arm 87 is repeated by the protrusion 89 every one reciprocation of the wiper.

The deformation direction of the wiper blade 14 contacting with the surface of the window glass 13 at the wipe-finishing position is opposite to that at the wipe-beginning position, and also the movement of the contactors 81, 82 determining these stop-positions is performed by pushing the protrusion 89 of the toothed wheel 78 rotating by a half every one rotation of the worm wheel 72 to the arm 87, so that the probability on the determination of these stop-positions is ½ when the wiper switch is turned off at random and consequently the deformation of the wiper blade in one direction is prevented in no use of the wiper.

Figure 16:
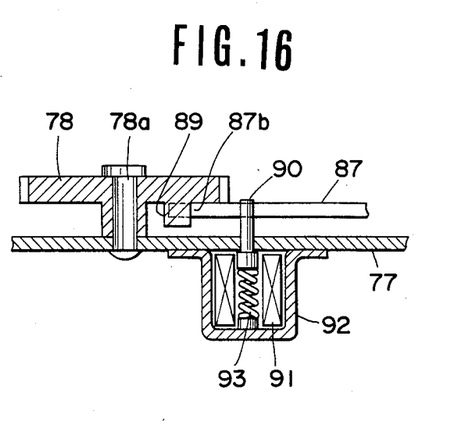
FIG. 16 is a sectional view of the plunger pin for engaging the arm.

Although the reciprocation movement of the arm 87 is repeatedly carried out during the operation of the wiper in the fourth embodiment, as shown, for example, in FIGS. 15 and 16, a plunger pin 90 may be arranged so as to suspend the arm 87 at the engaged state of the protrusion 89 with the other end portion 87b of the arm 87 (at the state shown in FIG. 15).

The plunger pin 90 is inserted into a center of a plunger pin casing 92 containing an electromagnet fixed along its inner wall. Further, the upper end portion of the plunger pin 90 projects through the cover 77 toward the inside of the gear housing 68 and is always energized in an up direction by a spring 93 disposed at the lower end side of the pin.

By exciting the electromagnet 91 only when the wiper switch is turned off, the plunger pin 90 is drawn into the inside of the plunger pin casing 92 to release the suspension against the arm 87.

Therefore, when the arm 87 is released, if the protrusion 89 is engaged with the other end portion 87b of the arm 87, the arm 87 is not moved, while if the protrusion 89 and the other end portion 87b are at a state of non-engagement relation, the arm 87 is moved by the reaction force of the spring 86 inside the contactor assembly 79 (see FIG. 12).

Moreover, when the operation of the wiper is completely stopped, the electromagnet is demagnetized and the plunger pin 90 is again energized by the spring 93, so that when the wiper is again operated, the plunger pin 90 suspends the arm 87 at a time of engaging the protrusion 89 with the other end portion 87b of the arm 87.

When using the plunger pin 90 as mentioned above, the movement of the arm 87 is not repeated during the operation of the wiper, so that the wearing of the moving portion by contact is prevented.

As mentioned above, according to the invention, the armature shortcircuiting contacts of the switch mechanism for forcedly stopping the operation of the wiper are shiftedly arranged at plural positions and the turnover means is further arranged, or the contact moving means is arranged for displacing the armature shortcircuiting contacts of the switch mechanism to plural positions, so that the stop-position of the wiper blade can be changed to prevent the deformation of the wiper blade in one direction during no use of the wiper. As a result, the parmanent deformation of the wiper blade can be prevented and also the good wiping performance can be maintained for a long time. Furthermore, it is not necessary to separate the wiper blade from the surface of the window glass in no use of the wiper.

What is claimed is:

1. A device for controlling a stop-position of an electric windshield wiper, which comprises a means for converting rotary motion of a wiper motor into reciprocative motion of a wiper to oscillate a wiper blade on a surface to be wiped and a switch mechanism provide with armature shortcircuiting contacts for turning off the wiper motor from a power source and shortcircuiting the armature of the wiper motor to forcedly stop the wiper blade when the wiper blade reaches to a predetermined position under a turn-off state of a wiper switch, characterized in that said armature shortcircuiting contacts of the switch mechanism are shiftedly arranged at plural positions for forcedly stopping the wiper motor at different positions, and further a turnover means is arranged for the plural armature shortcircuiting contacts.

2. A device according to claim 1, wherein said armature shortcircuiting contacts of the switch mechanism comprises a contact base rotating together with a shaft of the wiper motor, and first, secnd and third contactors contacting with the contact base in such a manner that the contacting positions of these first to third contactors are shifted in a rotational direction of the contact base.

3. A device according to claim 1, wherein said turnover means for the armature shortcircuiting contacts comprises a cam switch rotating together with the shaft of the wiper motor.

4. A device according to claim 1, wherein said turnover means for the armature shortcircuiting contacts comprises a self-holding type relay switching over every on-off of the wiper switch.

5. A device for controlling a stop-position of an electric windshield wiper, which comprises a means for converting rotary motion of a wiper motor into reciprocative motion of a wiper to oscillate a wiper blade on a surface to be wiped and a switch mechanism provided with armature shortcircuiting contacts for turning off the wiper motor from a power source and shortcircuiting the armature of the wiper motor to forcedly stop the wiper blade when the wiper blade reaches to a predetermined position under a turn-off state of a wiper switch, characterized in that said device is further provided with a contact moving means for displacing said armature shortcircuiting contacts of the switch mechanism to plural positions for forcedly stopping the wiper motor at different positions.

6. A device according to claim 5, wherein said armature shortcircuiting contacts of the switch mechanism comprises a contact plate rotating together with a shaft of the wiper motor and contactors contacting with the contact plate and capable of being displaced by said contact moving means.

7. A device according to claim 6, wherein said contact moving means comprises an assembly of a protrusion driven by the shaft of the wiper motor and an arm periodically engaging at one end with said protrusion and pushing the contact at the other end under such engagement state.

* * * * *